United States Patent [19]
Niwa

[11] Patent Number: 5,959,317
[45] Date of Patent: Sep. 28, 1999

[54] HIGH FREQUENCY HETERO JUNCTION TYPE FIELD EFFECT TRANSISTOR USING MULTILAYER ELECTRON FEED LAYER

[75] Inventor: Takaki Niwa, Tokyo, Japan

[73] Assignee: NEC Corporation, Tokyo, Japan

[21] Appl. No.: 08/979,177

[22] Filed: Nov. 26, 1997

[30]       Foreign Application Priority Data

Nov. 28, 1996 [JP] Japan .................................. 8-317627
Jul. 3, 1997 [JP] Japan .................................. 9-178471

[51] Int. Cl.$^6$ ...................... H01L 29/778; H01L 29/205
[52] U.S. Cl. ...................... 257/194; 257/280; 257/284; 257/192; 257/279; 257/20
[58] Field of Search .................................. 257/280, 284, 257/194, 192, 279, 20

[56]             References Cited

U.S. PATENT DOCUMENTS 5,258,632 11/1993 Sawada .................................. 257/194
5,436,470 7/1995 Nakajima .................................. 257/20
5,652,440 7/1997 Chang .................................. 257/194

FOREIGN PATENT DOCUMENTS 57-176773 10/1982 Japan .
3-28065 4/1991 Japan .

OTHER PUBLICATIONS

"High–Performance InP–Based Enhancement–Mode HEMT's Using Non–Alloyed Ohmic Contacts and Pt–Based Buried–Gate Technologies" by Kevin J. Chen et al. IEEE Transaction on Electron Device, vol. 43, No.2 pp. 252–253, Feb. 1996.

*Primary Examiner*—Peter Toby Brown
*Assistant Examiner*—Hung Van Duong
*Attorney, Agent, or Firm*—Sughrue, Mion, Zinn, Macpeak & Seas, PLLC

[57]             ABSTRACT

A hetero junction type field effect transistor can control a short channel effect, reduce the fluctuation of a threshold, and improve a yield. The hetero junction type field effect transistor comprises: a semiconductor substrate, a first electron feed layer made of a doped semiconductor having a wider band gap than the channel layer, a channel layer made of a non-doped semiconductor, a second electron feed layer comprising a laminate structure of a plurality of semiconductor layers having a wider band gap than the channel layer and having a thickness of 100 Å or less, and a gate electrode, a source electrode, and a drain electrode.

4 Claims, 14 Drawing Sheets

STRUCTURAL VIEW OF FROM i-InGaAs CHANNEL LAYER
TO GaAs SUBSTRATE IN FIG. 1 AND FIG. 6

HIGH FREQUENCY HETERO JUNCTION TYPE FIELD EFFECT TRANSISTOR USING MULTILAYER ELECTRON FEED LAYER

BACKGROUND OF THE INVENTION

1. Field of the Invention

The present invention relates to a semiconductor device, and more specifically, it relates to a hetero junction type field effect transistor which can control a short channel effect.

2. Description of the Related Art

FIG. 10 is a sectional view showing one example of a conventional HJFET (which is also called HEMT) which is disclosed in Japanese Patent Application Laid-open No. 176773/1982. The high-frequency characteristics of the HJFET are in inverse proportion to a time during which electrons flow through a gate electrode 8, and therefore, the shortening of a gate length is important to improve the high-frequency characteristics.

However, if the gate length is simply shortened, a short channel effect noticeably comes out. This short channel effect is a phenomenon that when the gate length is shortened, a threshold voltage fluctuates to a negative side and subthreshold properties deteriorate. If the threshold voltage fluctuates, the yield of elements during an element manufacture process deteriorates, and even if a gate voltage is set to the threshold voltage, a drain current begins to flow owing to the deterioration of the subthreshold properties, so that a leak current increases. Accordingly, reducing the short channel effect is desired if particularly in order to achieve a high integration, a high yield and the low consumption of electric power are required.

The above reduction of the short channel effect can be achieved, if the charge control of a channel layer 3 by the electric charges of the gate electrode 8 can be carried out more predictably.

One method, where in a conventional HJFET structure shown in FIG. 10, is to lessen a distance between the gate electrode 8 and electrons flowing through the channel layer 3 by thinning an electron feed layer 15. However, when the electron feed layer is thinned, that the threshold voltage increases, and therefore the setting of the low threshold voltage is impossible. This results because the electron feed layer decides the number of electrons in the channel layer 3 and the threshold voltage, and if the thickness of the electron feed layer decreases, than the number of the electrons present in the channel layer 3 decreases, which causes the threshold voltage to increase undesirably.

In addition, when the electron feed layer is thinned, the leak current between the gate 8 and the channel layer 3 increases noticeably. This results because, the electron feed layer 15 also functions as a barrier layer for preventing the electrons in the channel layer 3 from directly flowing into the gate electrode 8, and if the thickness of the electron feed layer 15 is decreased, the barrier layer is thinned, which causes the gate leak current to increase undesirably. Therefore, the technique of simply thinning the electron feed layer cannot be employed.

Another method comprises controlling the diffusion of the electrons which flow through the channel layer into a GaAs substrate. FIG. 11 shows a sectional structure view of an HJFET disclosed in Japanese Patent Publication (kokoku) No. 28065/1991. In the HJFET in FIG. 11, an n-GaAs layer highly doped with a donor is put in the channel layer 11, so that a band can concavely curve around the n-GaAs layer and the electrons are likely to intensively gather in the channel layer. Furthermore, this channel layer is sandwiched between i-AlGaAs layers to form hetero junction interfaces, whereby the electrons in the channel layer are prevented from diffusing into the GaAs substrate 5 and the gate. In consequence, the short channel effect when the gate length is about 1 μm can be controlled. Moreover, the thickness of the channel layer 11 is 100 Å or less, and hence the transportation properties of the electrons can be improved by a quantum effect, whereby the improvement of device characteristics can be accomplished.

In this HJFET structure, the short channel effect which occurs when the gate length is about 1 μm can be controlled, however the short channel effect when the gate length is about 0.1 μm cannot sufficiently be controlled. If the gate length is as short as about 0.1 μm, the amount of the electric charges on the gate metal 8 which can be used for the control of the electric charges in the channel layer 11 decreases, so that it is difficult to control the electrons present in the channel layer 11. In consequence, the short channel effect cannot be sufficiently controlled only by preventing the electrons from diffusing into the GaAs substrate 5.

Furthermore, a second problem of the above method is that the device characteristics tend to deteriorate. This results because in the channel layer 11, the n-GaAs layer, in which the electric charges particularly intensively gather, is highly doped with the donor, and hence the transportation properties of the electrons deteriorate owing to "the ionized impurity scattering effect" caused by the donor with which the n-GaAs is highly doped.

SUMMARY OF THE INVENTION

An object of the present invention is to provide a hetero junction type transistor structure which can control a short channel effect, decrease the fluctuation of a threshold and improve a yield.

According to the present invention, a hetero junction type transistor structure can be provided in which the short channel effect can be controlled, whereby subthreshold properties can be improved and a drain current under a threshold voltage can be reduced to decrease the consumption of an electric power. Furthermore, according to the present invention, a hetero junction type transistor structure can be provided in which gm characteristics of the transistor can be improved to obtain excellent device characteristics.

The present invention is directed to a hetero junction type field effect transistor in which a channel layer made of a non-doped semiconductor formed on a semiconductor substrate, a first electron feed layer made of a doped semiconductor having a wider band gap than the channel layer, and a second electron feed layer made of a doped semiconductor having a wider band gap than the channel layer and having a thickness of 100 Å or less are formed so that the channel layer is sandwiched between the first electron feed layer on a lower side and the second electron feed layer on an upper side, and a gate electrode, a source electrode and a drain electrode are formed on the second electron feed layer.

In the present invention, the channel layer is sandwiched between the first and second electron feed layers, and the thickness of the second electron feed layer on the gate side is limited to 100 Å or less. In consequence, a distance (Δd) between a gate metal and the position of electrons in the channel layer can be lessened, so that the short channel effect can be controlled.

Since the Δd can be lessened, the control of the electrons in the channel layer by electric charges of the gate metal can be easy, and gm can be improved, so that the improvement of the device characteristics can be accomplished.

Furthermore, a threshold voltage can be adjusted by the thickness of the first electron feed layer on the side of the substrate, even if the electron feed layer on the side of the gate is thinned, and therefore the threshold voltage does not become high.

In addition, even in the case of an enhancement type transistor (E-FET) structure having a threshold voltage of about 0.1 V, the electrons in the channel layer can be gathered in the electron feed layer on the side of the substrate by thickening the electron feed layer on the side of the substrate which is the first electron feed layer rather than thickening the electron feed layer on the side of the gate which is the second electron feed layer. By this effect, the position of the electrons does not move in a direction away from the gate, even if the gate voltage is close to the threshold, and hence the subthreshold properties in the vicinity of the threshold voltage can be improved. Therefore, when the gate voltage is near the threshold, a drain current (a drain leak current) can be reduced, and the low consumption of the electric power can be achieved. Simultaneously, the fluctuation of the threshold by the short channel effect can more effectively be reduced.

In the present invention, the electron feed layer on the side of the gate may be in the form of a single layer but it can take a multi-layer structure. When the multi-layer structure is employed, it is preferred that at least the layer which is in contact with the channel layer is doped, and one layer of the layers which are not in contact with the channel layer is a doped or a non-doped semiconductor layer having a wider band gap than an average band gap of the second electron feed layer. For example, in the case of the three-layer structure, an AlAs layer having a wider band gap than the average band gap of the second electron feed layer can be used as an inside layer, and the upper and lower layers of the AlAs layer can be made of the other doped semiconductor layers. According to this constitution, a substantial barrier height between the gate metal and the channel layer increases, whereby a gate leak current between the gate metal and the channel layer can be more reduced than in the conventional case, even if the thickness of the second electron feed layer on the side of the gate is set to 100 Å or less, and simultaneously the consumption of the electric power can be decreased.

In these drawings,
1 is an n-AlGaAs/n-AlAs/n-AlGaAs electron feed layer.
2 is an n-AlGaAs electron feed layer.
3 is an InGaAs channel layer.
4 is an AlGaAs buffer layer.
5 is a GaAs substrate.
6 is an $n^+$-GaAs cap layer.
7 is a source electrode.
8 is a gate electrode.
9 is a drain electrode.
10 is an AlGaAs spacer layer.
11 is an i-GaAs/n-GaAs/i-GaAs channel layer.
12 is an alloy region.
13 is an InGaAs channel layer in which an In composition is increased toward the direction of the GaAs substrate.
14 is an n-AlAs layer.
15 is an n-AlGaAs electron feed layer.
16 is an electron feed layer on the side of a gate.
17 is an n-AlGaAs layer containing an Al composition in a high ratio.

DETAILED DESCRIPTION OF THE INVENTION

First Embodiment

Figure 1:
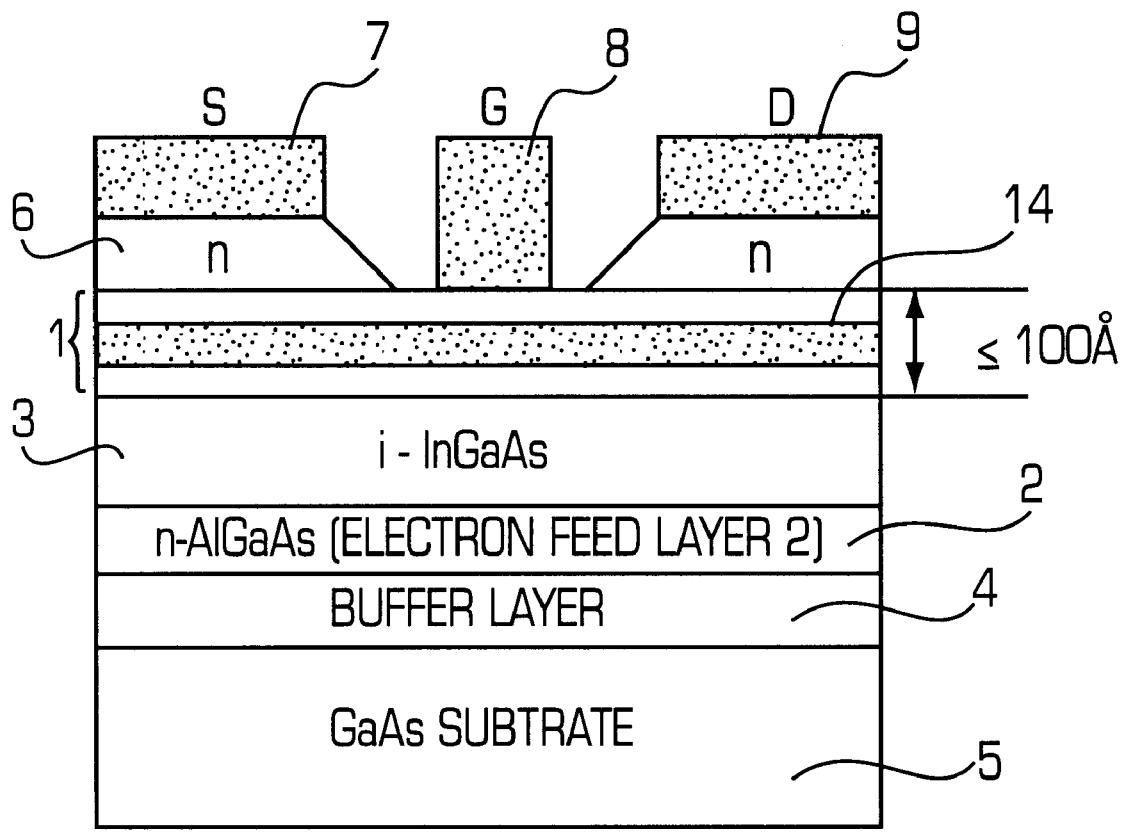
FIG. 1 is a sectional view of a hetero junction type transistor for explaining a first example of the present invention.

FIG. 1 is a sectional view of a hetero junction type transistor showing a first embodiment of the present invention. A channel layer 3 of i-InGaAs is sandwiched between two electron feed layers. The electron feed layer 1 on the side of a gate which is a second electron feed layer has a structure where an n-AlAs layer or an i-AlAs layer 14 is sandwiched between n-AlGaAs layers. The total thickness of this electron feed layer 1 is limited to 100 Å or less.

Figure 3:
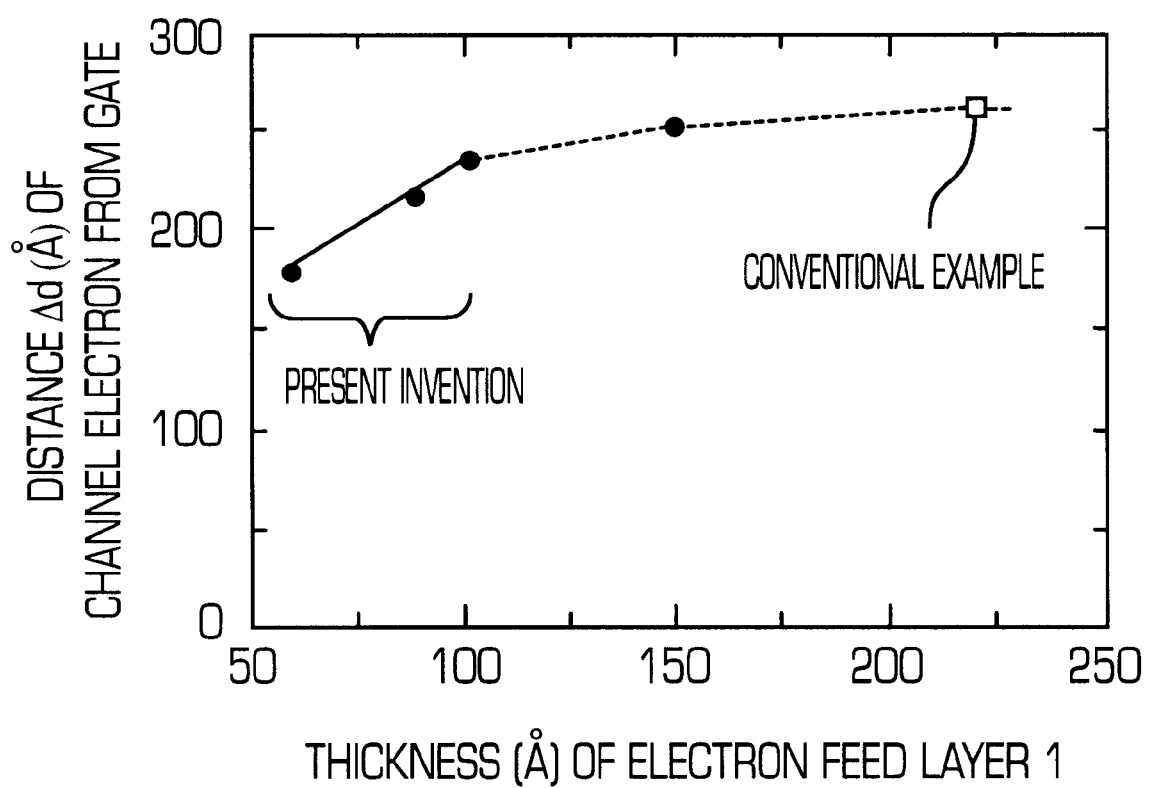
FIG. 3 is a characteristic view function of the present invention.

As shown in a characteristic view of FIG. 3, if the thickness of the electron feed layer 1 is 100 Å or less, a distance Δd between channel electrons and a gate electrode 8 rapidly decreases. By the decrease of this distance Δd, a short channel effect can be effectively reduced.

Furthermore, an AlAs layer 14 is formed as an inside layer of the electron feed layer 1 in order to prevent the increase of a leak current between the gate 8 and the channel layer 3. Here, the electron feed layer 1 is not made of the AlAs layer 14 alone or an AlGaAs layer alone containing an Al composition in a high ratio because, in the case of the AlGaAs layer largely containing the Al composition, Al is etched even by water washing or the like, which is inconvenient in a device manufacturing process.

An electron feed layer 2 of n-AlGaAs, which is a first electron feed layer, is introduced in order to adjust a threshold voltage which is increased by setting the thickness of the electron feed layer 1 to 100 Å or less. When an E-FET having a threshold of 0.1 V is manufactured, the thickness of the electron feed layer 2 is in the range of 100 to 150 Å.

A buffer layer 4 is preferably made of a non-doped 20 semiconductor having the same band gap as in the electron feed layer 2. In the case that the electron feed layer 2 is a n-AlGaAs layer, the buffer layer 4 is suitably an i-AlGaAs layer. This is preferable because if the semiconductor of an AlGaAs system such as AlGaAs or AlAs is used as the material for the electron feed layers 1, 2, the thickness of the electron feed layer 2 becomes 100 Å or more, which causes an energy band to lower, and if the buffer layer 4 has a smaller band gap than the electron feed layer 2, the electrons accumulate in an interface between the electron feed layer 2 and the buffer layer 4.

Next, the function of the hetero junction type field effect transistor shown in FIG. 1 will be described with reference to FIGS. 2 to 5(a) & 5(b).

Figure 2:
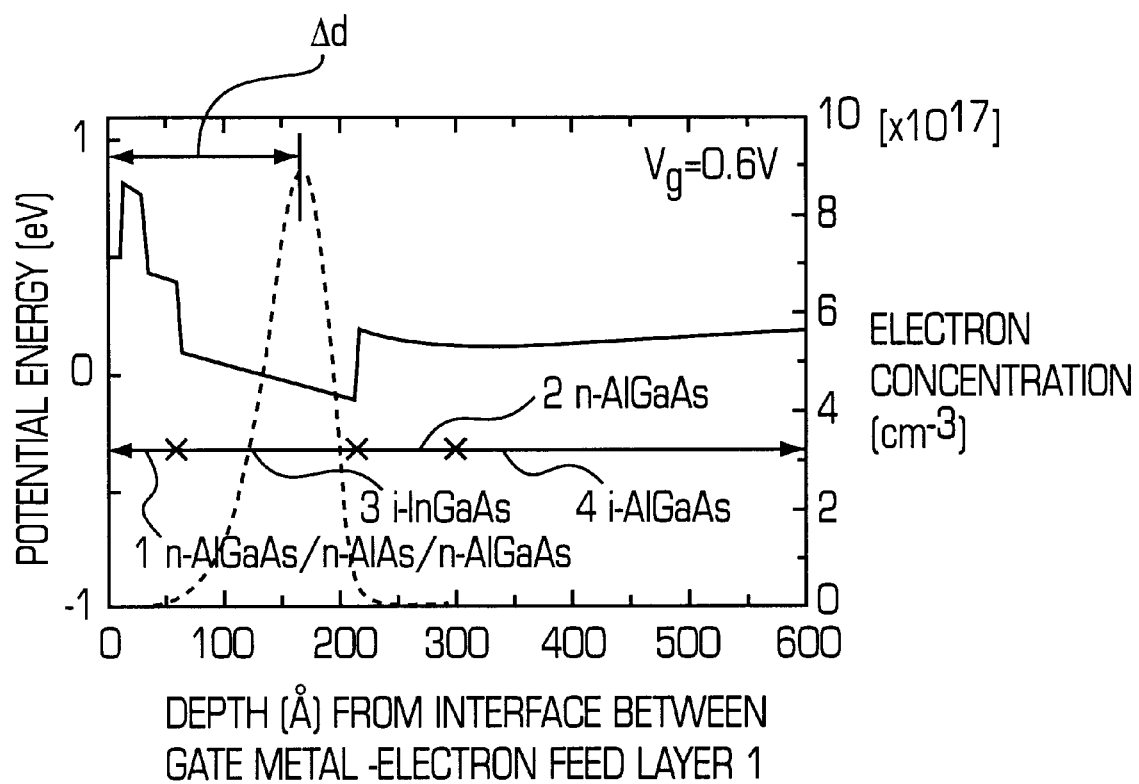
FIG. 2 shows a band diagram of the first example of the present invention and an electron concentration distribution.

FIG. 2 shows an energy band structure of the present invention and an electron concentration distribution. The abscissa axis of this drawing denotes the depth toward the GaAs substrate 5 from the interface between the gate metal 8 and the electron feed layer 1. In this drawing, the solid line represents the energy band structure, and the dotted line represents the electron concentration distribution. This drawing shows a case where a voltage of 0.6 V is applied to the gate metal.

First, the energy band drawing will be described. In this case, the electron feed layer 1 is an $Al_{0.2}Ga_{0.8}As$ layer having a thickness of 60 Å and an Si-doped concentration of $2 \times 10^{18}$ cm$^{-3}$ and in this electron feed layer, an AlAs layer 14 having a thickness of 20 Å is inserted an inside layer. The band structure of the electron feed layer 1 is convex. The thickness of the electron feed layer 1 is limited to 100 Å or less, and so the band of the channel layer 3 is dragged and raised on the side of the electron feed layer 1. The electron feed layer 2 which is positioned under the channel layer 3 lowers the band of the channel layer 3, whereby the band of the channel layer 3 is prevented from being excessively raised by the electron feed layer 1 to increase the threshold voltage. In this drawing, the electron feed layer 2 is an $Al_{0.2}Ga_{0.8}As$ layer having a thickness of 120 Å and an Si-doped concentration of $2 \times 10^{18}$ cm$^{-3}$, and its threshold voltage is 0.1 V.

Here, since the band of the electron feed layer 2 lowers, if a hetero interface is formed between the electron feed layer 2 and the buffer layer, the electrons will accumulate in this interface portion. Therefore, the buffer layer is suitably made of the same semiconductor as the electron feed layer 2. In this drawing, i-$Al_{0.2}Ga_{0.8}As$ is used, and hence the electrons are not accumulated between the electron feed layer 2 and the buffer layer 4.

Next, the electron concentration distribution will be described. Similarly as shown in FIG. 2, the electrons intensively gather in the channel layer 3, and they particularly intensively gather on the side of the electron feed layer 2 in the channel layer. This results because the band of the channel layer lowers toward the electron feed layer 2. Therefore, a distance $\Delta d$ between the peak position of an electron concentration and the gate metal 8 is decided substantially by the sum of thicknesses of the electron feed layer 1 and the channel layer 3, as understood from the drawing. In the structure of the present invention, therefore, the decrease of the thicknesses of the electron feed layer 1 and the channel layer 3 is important to control the short channel effect.

Next, the thickness of the electron feed layer 1 will be described. FIG. 3 shows the dependence of the distance $\Delta d$ on the thickness of the electron feed layer 1 (which corresponds to reference numeral 15 in FIG. 10) when the threshold voltage is fixed to 0.1 V and the thickness of the channel layer is 150 Å. Incidentally, for the adjustment of the threshold, the thickness of the electron feed layer 2 varies from 0 to 120 Å. In a conventional example shown in FIG. 10, the thickness of the electron feed layer 15 (which corresponds to reference numeral 1 in FIG. 1) is required to be 220 Å in order that the threshold voltage may be 0.1 V, and at this time, the distance $\Delta d$ is 250 Å. The distance $\Delta d$ scarcely changes, even when the thickness of the electron feed layer 1 is reduced from 220 Å to 100 Å, because the peak position of the electron concentration in the channel layer 3 moves from the side of the electron feed layer 1 to the side of the electron feed layer 2 so as to be away from the gate electrode 8 on the basis of the balance of the thicknesses of the electron feed layer 1 and the electron feed layer 2, so that the reduced thickness of the electron feed layer 1 is offset. Therefore, in order to reduce the distance $\Delta d$, the thickness of the electron feed layer 1 is required to be at least 100 Å or less.

However, if the electron feed layer 1 is excessively thin, a gate leak current between the gate and the channel layer rapidly increases.

Figure 4:
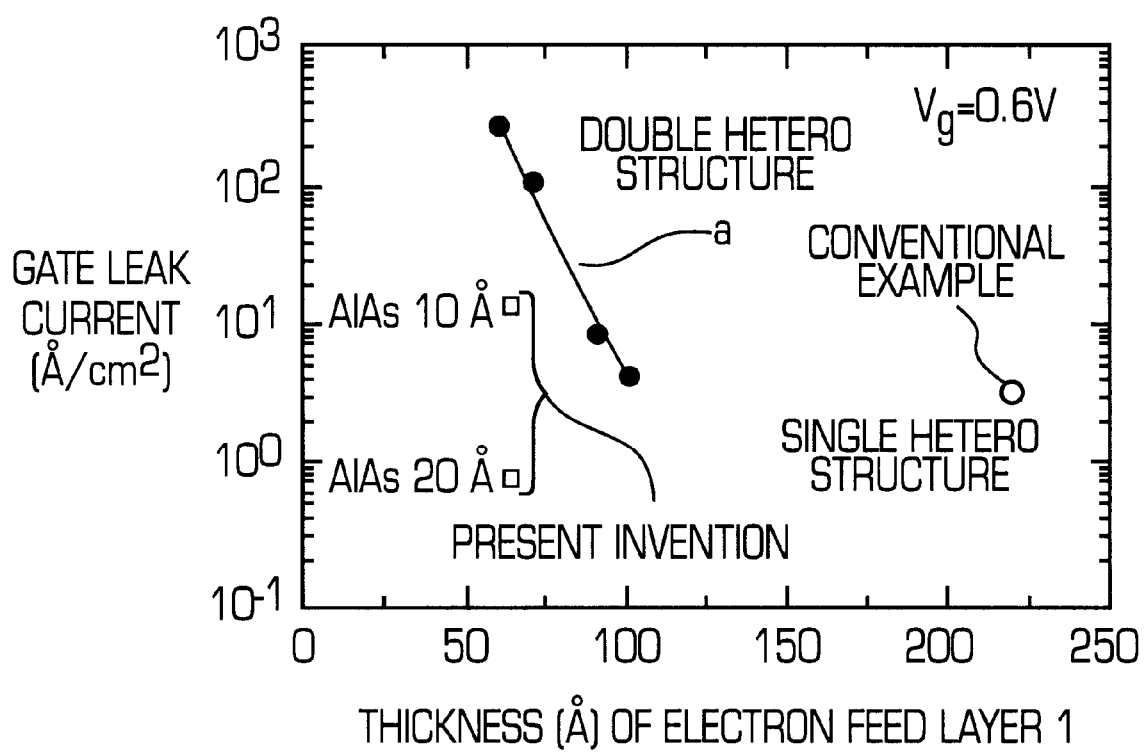
FIG. 4 is a characteristic view function of the present invention.

FIG. 4 shows a relation between the thickness of the electron feed layer 1 (which corresponds to reference numeral 15 in FIG. 10) and the gate leak current. A gate voltage is 0.6 V. For reference, a gate leak current value in the case of a conventional example is also shown. A solid line a corresponds to the structure of FIG. 1 when the AlAs layer 14 is not introduced into the electron feed layer 1. When the AlAs layer 14 is not present, the gate leak current is larger in the structure of the present invention than in the conventional example, but it is apparent that when the AlAs layer 14 having a thickness of 20 Å is introduced, the gate leak current is more controlled than in the conventional example, even if the thickness of the electron feed layer 1 is set to 60 Å. Therefore, when the thickness of the electron feed layer 1 is set to 60 Å, it is preferred that the AlAs layer having a thickness of 20 Å is introduced into the electron feed layer 1.

Furthermore, in the present invention, the minimum thickness of the electron feed layer can be decided in suitably regulating the band gap of the inside layer to be introduced into the electron feed layer 1 and the thickness of the inside layer in consideration of the allowable leak current, but if the thickness of the electron feed layer is excessively thin, the leak current cannot be sufficiently lowered. Therefore, in general, the thickness of the electron feed layer is preferably 30 Å or more.

Figure 13:
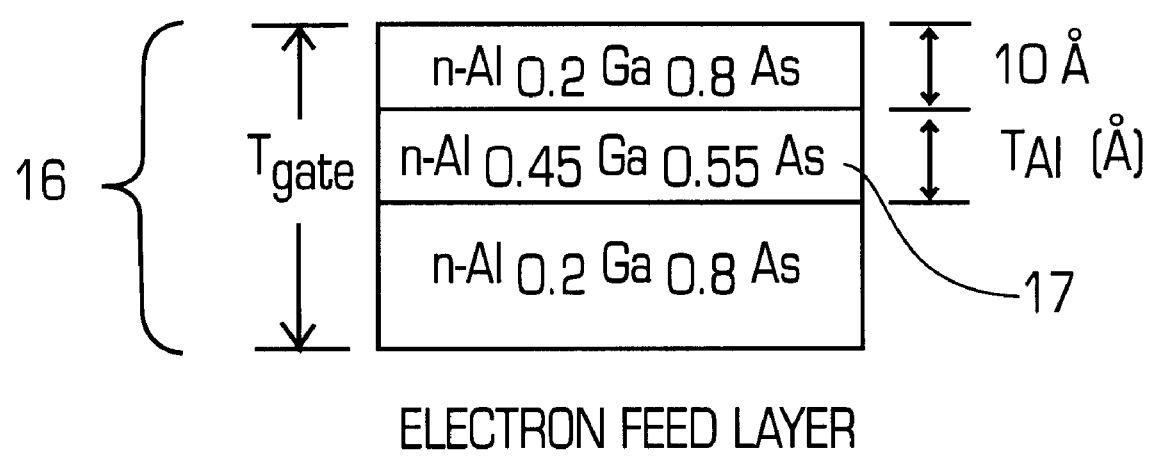
FIG. 13 shows a structure of an electron feed layer (an electron feed layer on the side of a gate) of the present invention.

FIG. 4 shows a case where the AlAs layer 14 is introduced into the electron feed layer 1, but the AlAs layer is deliquescent and so there is a problem that the AlAs layer is poor in adaptation to a device process. Accordingly, from a practical viewpoint, the AlAs layer 14 is preferably replaced with an $Al_{0.45}Ga_{0.55}As$ layer 17 as shown in FIG. 13, and the employment of an electron feed layer 16 having a three-layer structure of $Al_{0.2}Ga_{0.8}As/Al_{0.45}Ga_{0.55}As/Al_{0.2}Ga_{0.8}As$ is preferable.

Figure 12:
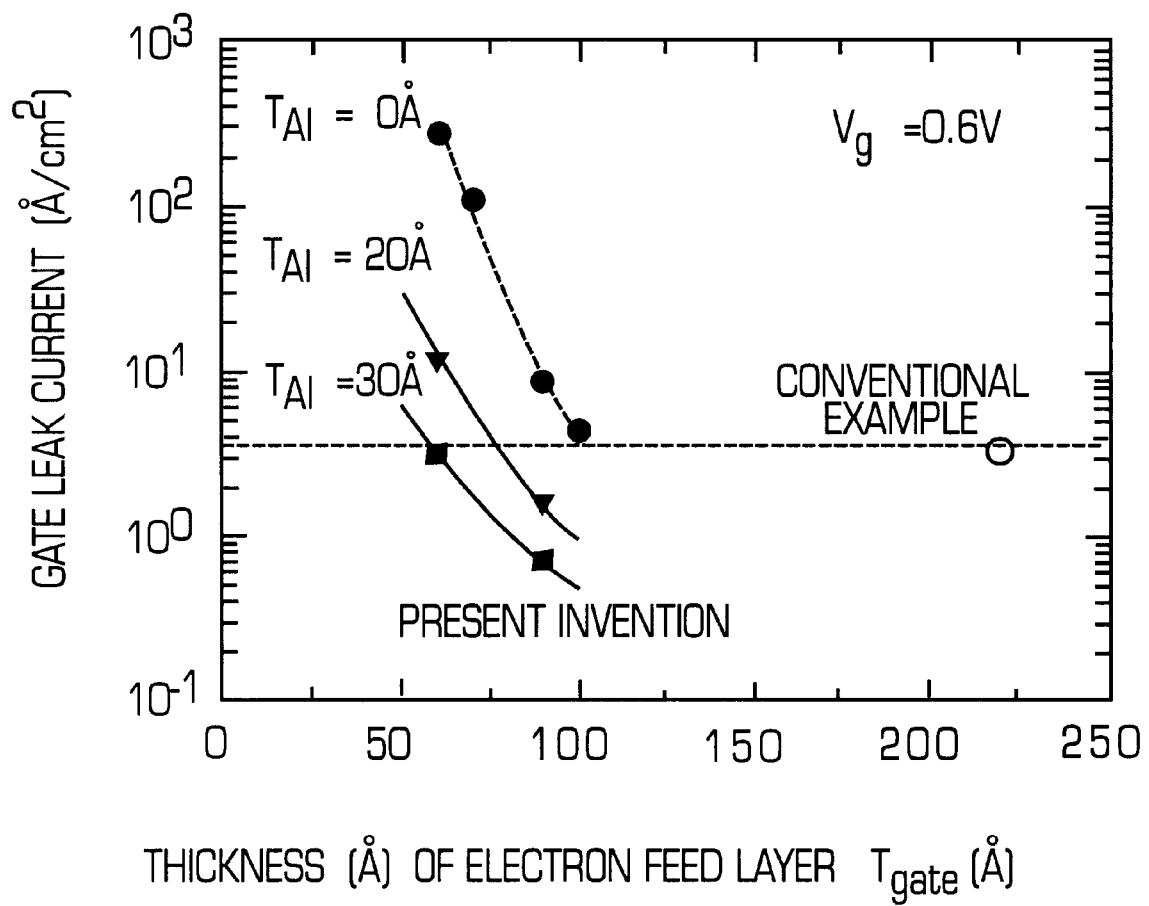
FIG. 12 is a characteristic view for explaining the function of the present invention.

FIG. 12 shows a relation between the thickness TAl of the $Al_{0.45}Ga_{0.55}As$ layer and the gate leak current in this case. As understood from FIG. 12, the gate leak current can be controlled to the same degree as in the conventional structure by inserting the $Al_{0.45}Ga_{0.55}As$ layer having a thickness of 30 Å, even when the thickness of the electron feed layer is 60 Å.

Thus, according to the present invention, the gate leak current can be reduced, and so the consumption of the electric power can be decreased.

Next, the thickness of the channel layer will be described. In the structure shown in FIG. 1, the decrease of the distance Δd depends also on the thickness of the channel layer. In the case that the channel layer 3 is i-InGaAs, the transportation properties of the electrons can be improved, as the In composition is increased, and so the increase of the In composition is preferable. However, as the In composition is increased, the lattice constant of InGaAs deviates from the lattice constants of AlGaAs and GaAs, so that crystal defects are easily introduced into InGaAs. Therefore, the In composition is preferably 0.35 or less, and if the In composition is more than this range, a large number of the crystal defects occurs in the InGaAs channel layer, which causes the transportation properties of the electrons to deteriorate.

The thickness of the channel layer 3 is set to a critical thickness or less, but this layer thickness decreases along with the increase of the In composition. This results in the decrease of the distance Δd in the structure of the present invention, and hence, the increase of the In composition in the channel layer is important not only for the improvement of the transportation properties of the electrons but also for the control of the short channel effect. For example, if the In composition in the InGaAs channel layer is 0.35, the critical layer thickness in this case is 60 Å. If the layer thickness is too thin, a carrier concentration deteriorates, and therefore, in general, it is preferably 40 Å or more.

Therefore, the distance Δd can be lessened by decreasing the thickness of the channel layer whereby not only the control of the short channel effect but also the improvement of gm can be accomplished.

Figure 10:
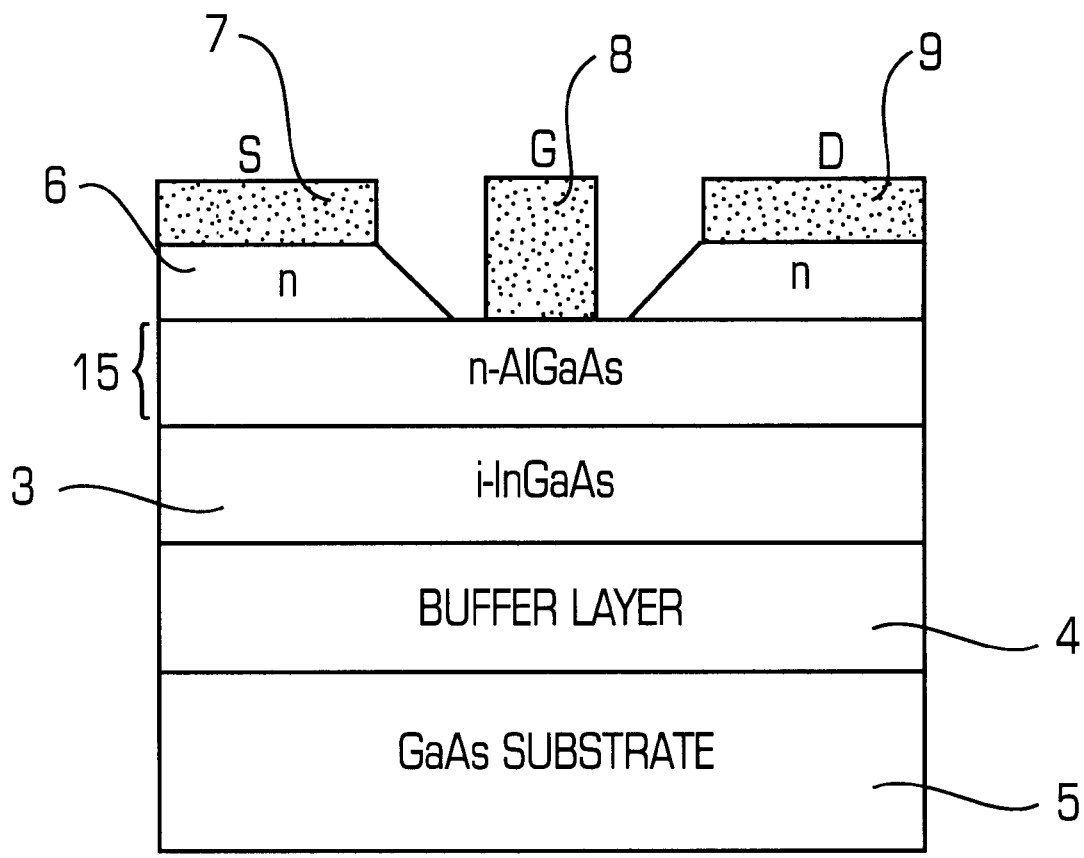
FIG. 10 is a sectional view of a conventional HJFET.

On the other hand, in a conventional example shown in FIG. 10, the electrons present in the channel layer 3 intensively gather on the side of the electron feed layer 15, and therefore the distance Δd is decided only by the thickness of the electron feed layer 15. In consequence, in the conventional example, even if the channel layer 3 is thinned, the distance Δd cannot be shortened and hence the short channel effect cannot be controlled.

Figure 5A:
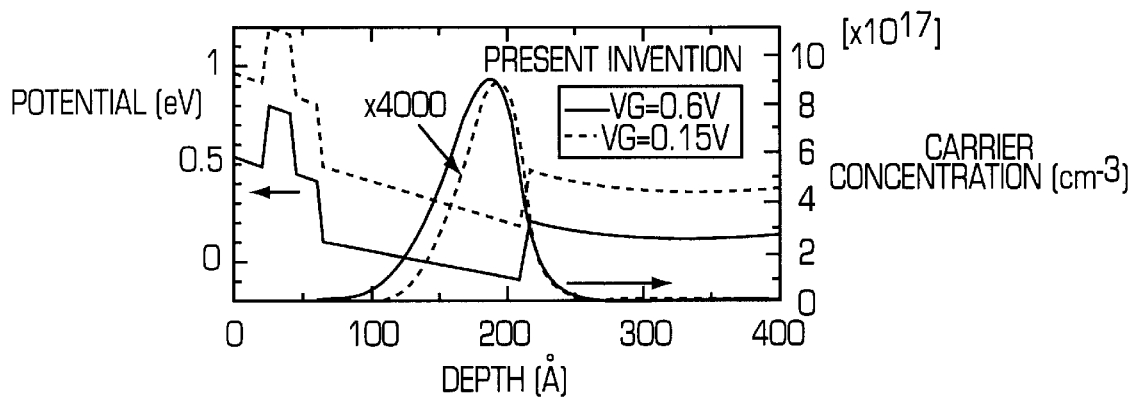
FIGS. 5(a) & 5(b) are chacteristic views of the present invention in comparison with a conventional structure.
Figure 5B:
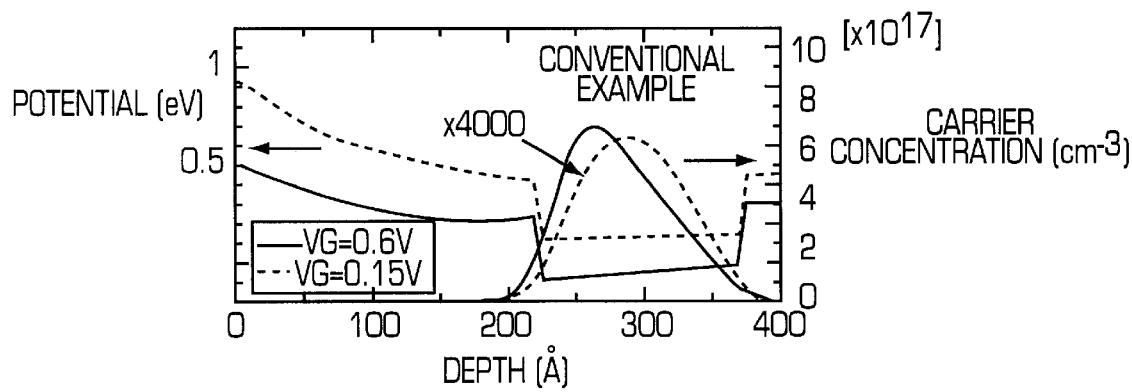

FIGS. 5(a) and 5(b) show changes in the band structure and the electron concentration distribution when there is a change in the gate voltage. The abscissa axis of this drawing denotes a depth from an interface between the gate electrode and the electron feed layer 1 (reference numeral 15 in FIG. 10) as in FIG. 2. In this drawing, the dotted lines represent a case where a gate voltage of 0.15 V which is in the vicinity of the threshold voltage, is applied, and the solid line represent a case where a gate voltage of 0.6 V is applied. In addition, the electron concentration distribution in the case that the gate voltage is 0.15 V is multiplied by 4000 in order to conform to a scale of the electron concentration distribution in the case that the gate voltage is 0.6 V.

As understood from the electron concentration distribution in the drawing, in the conventional example shown in FIG. 10, when the gate voltage approaches the threshold voltage the peak position of the electron concentration moves away from the gate and simultaneously the electrons diffuse in the channel layer, as shown in FIG. 5(b). In the conventional structure, therefore, the control of the electrons in the channel layer 3 by the electric charges of the gate electrode 8 is difficult, as the gate voltage approaches the threshold voltage. This shortcoming is similar in the conventional example shown in FIG. 11.

On the other hand, in the present invention, even when the gate voltage approaches the threshold voltage, the peak position of the electron concentration and an electron concentration distribution shape change minimally, and the control of the electrons in the channel layer by the electric charges of the gate electrode 8 can easily be carried out. Therefore, the short channel effect can effectively be controlled.

Furthermore, since the electron concentration distribution and position do not change in the vicinity of the threshold, the subthreshold properties can be improved, and the drain current in the case that the gate voltage is the threshold voltage can be decreased, whereby the consumption of the electric power can be decreased.

The concentration distribution depend minimally on the gate voltage in the present invention because, since the electron feed layer is as thin as 100 Å or less, the electrons intensively gather in a hetero junction interface between the channel layer 3 and the electron feed layer 2 even under a voltage in the vicinity of the threshold, and the electrons are prevented from diffusing into the electron feed layer 2 by discontinuous bands present in the hetero junction interface.

In the structure of the present invention, the electron distribution in the channel layer is a characteristic electron distribution which is largely different from that of the conventional structure. The reason why the short channel effect can be effectively controlled by this characteristic electron distribution is explained below.

Figure 14A:
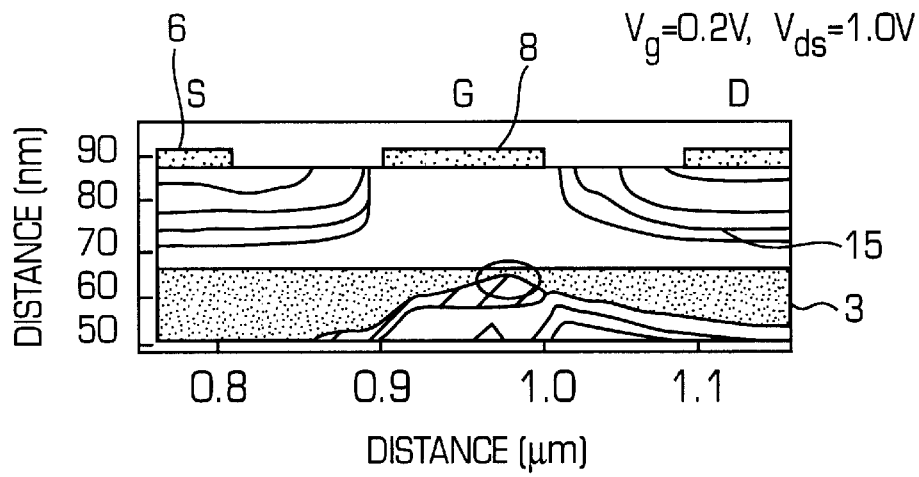
FIG. 14(a) shows an electron concentration distribution in the conventional structure.
Figure 14B:
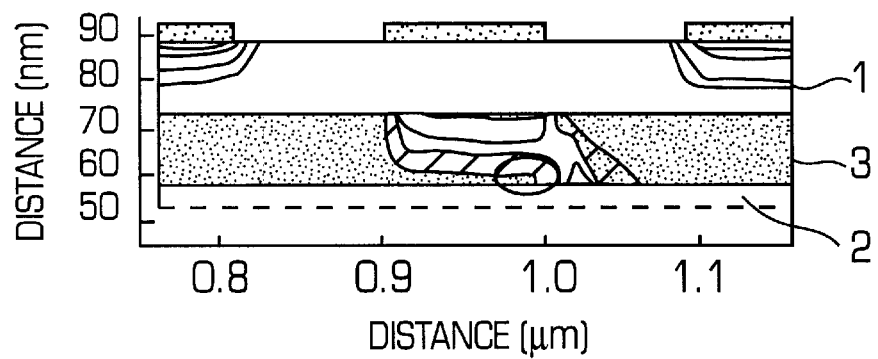
FIG. 14(b) shows an electron concentration distribution in the structure of the present invention.

FIGS. 14(a) and 14(a) show an electron concentration distribution in the vicinity of the gate. On the electron feed layer, the gate electrode 8 and $n^+$-GaAs cap layers 6 present under the source electrode and the drain electrode are partially shown. The abscissa axis of this drawing denotes a distance in a source-drain direction, and the ordinate axis denotes a distance in a depth direction of an epitaxial layer. The gate voltage is 0.2 V which is in the vicinity of the threshold, and the drain voltage is 1.0 V. FIG. 14(a) shows the electron concentration distribution in the conventional structure, and FIG. 14(b) shows the electron concentration distribution in the structure of the present invention.

In this drawing, a high electron concentration portion in the channel layer is represented by a crossed hatching, and a lower electron concentration portion than the above portion is represented by a one-directional hatching, and a further lower electron concentration portion is represented by equal concentration lines in place of the hatching. In addition, a region surrounded by an ellipse in the channel layer is a pinch-off region, which inhibits the electrons from flowing through a channel region under the gate in the state of depletion.

In the conventional structure, the threshold lowers owing to the short channel effect, which causes a few electrons to flow through. As is apparent from FIG. 14(a), when the gate voltage is 0.2 V, an electron density in the pinch-off region surrounded by the ellipse is high, so that the channel is not completely depleted. This reason will be described as follows.

In the case that a gate length is sufficiently long, a potential of the pinch-off region is substantially controlled by a gate potential. However, if the gate length is short, the potential of the pinch-off region is affected minimally by the gate potential, so that an influence of the decrease of the potential by a drain potential becomes more noticeable. As a result, when the gate length is shortened, the potential of the pinch-off region is further lowered, which causes the threshold to deteriorate. Therefore, in the case of the electron distribution in which the decrease of the potential of the pinch-off region by the drain potential easily occurs, the short channel effect takes place more easily.

As understood from FIG. 14(a), in the conventional structure, both the electrons in the pinch-off region in the channel layer and the electrons under the $n^+$-GaAs cap layer on the side of the drain intensively gather in the hetero interface on the side of the gate. And the potential of the pinch-off region is very easily affected by the potential under the n$^+$-GaAs cap layer. In consequence, the deterioration of the threshold voltage by the short channel effect occurs easily.

On the contrary, in the structure of the present invention, as is apparent from FIG. 14(b), the electrons in the vicinity of the pinch-off region intensively gather in the hetero interface on the side of the substrate, and on the other hand, the electrons under the n$^+$-GaAs cap layer on the drain side intensively gather in the hetero interface on the side of the gate by the influence of the n$^+$-GaAs cap layer. Therefore, in the vicinity of the drain side of the gate, the electron distribution is separated into an upper portion and a lower portion of the channel layer so as to deviate as much as a layer thickness. In short, in the structure of the present invention, the region having the low potential in which the electrons intensively gather is separated in the vicinity of the drain side of the gate, and therefore the influence of the drain potential does not directly appear as the decrease of the potential of the pinch-off region. As described above, in the structure of the present invention, the electron concentration distribution which is different from that of the conventional case is formed, whereby the short channel effect can effectively be controlled.

Figure 8:
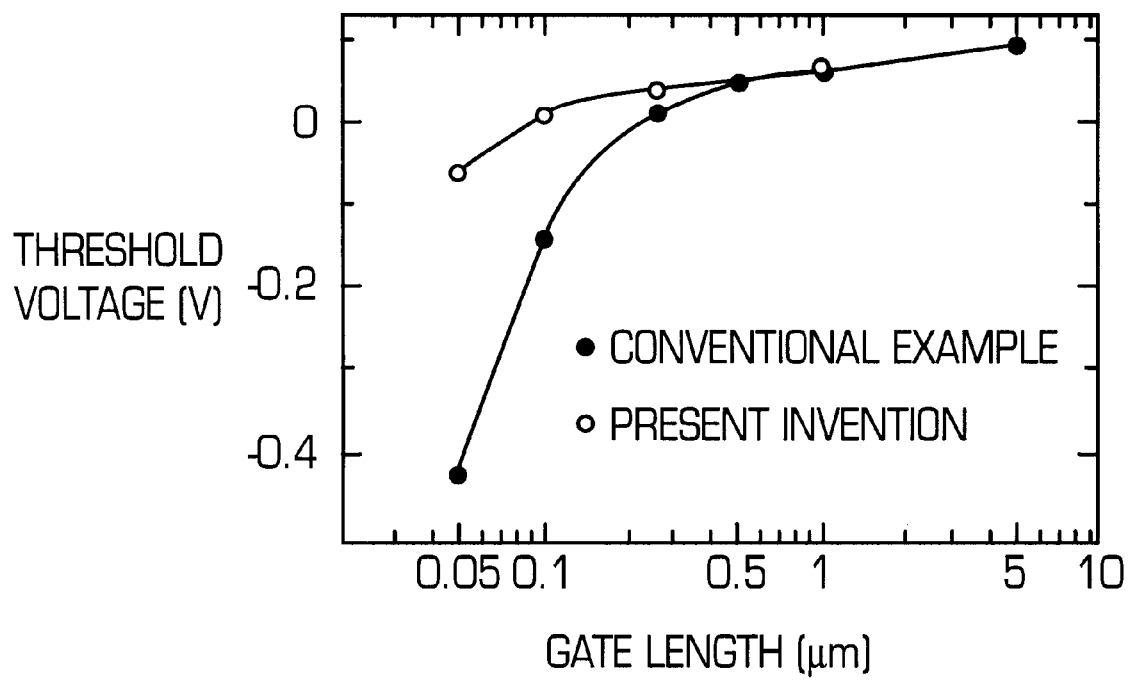
FIG. 8 is a graph showing a relation between the gate length and a threshold voltage.

FIG. 8 is a characteristic view showing that the short channel effect is effectively controlled by the present invention. The abscissa axis represents the gate length and the ordinate axis represents the threshold voltage. In the conventional example, the threshold decreases rapidly when the gate length shortens from about 0.25 $\mu$m, and the fluctuation of the threshold voltage corresponding to the variation in the gate length increases, so that the yield deteriorates. However, the deterioration of this threshold can be effectively controlled in the present invention of FIG. 1. As understood from FIG. 8, as long as the gate length is 0.1 $\mu$m or less, the threshold voltage decreases minimally, so that the deterioration of the yield scarcely occurs.

The characteristics of the present invention shown in FIG. 8 are concretely the results obtained by measuring a device having the following structure. In FIG. 1, the electron feed layer 1 comprises a three-layer structure of an Al$_{0.2}$Ga$_{0.8}$As layer having a thickness of 20 Å and an Si-doped concentration of $2\times10^{18}$ cm$^{-3}$, an AlAs having a thickness of 20 Å and an Si-doped concentration of $2\times10^{18}$ cm$^{-3}$, and an Al$_{0.2}$Ga$_{0.2}$As layer having a thickness of 20 Å and an Si-doped concentration of $2\times10^{18}$ cm$^{31\ 3}$. The electron feed layer 2 is an Al$_{0.2}$Ga$_{0.8}$As layer 20 having a thickness of 120 Å and an Si-doped concentration of $2\times10^{18}$ cm$^{-3}$ and the channel layer is an i- In$_{0.25}$Ga$_{0.75}$As layer having a thickness of 70 Å, and the buffer layer 4 is an i-Al$_{0.2}$Ga$_{0.8}$As layer having a thickness of 500 Å.

Figure 9:
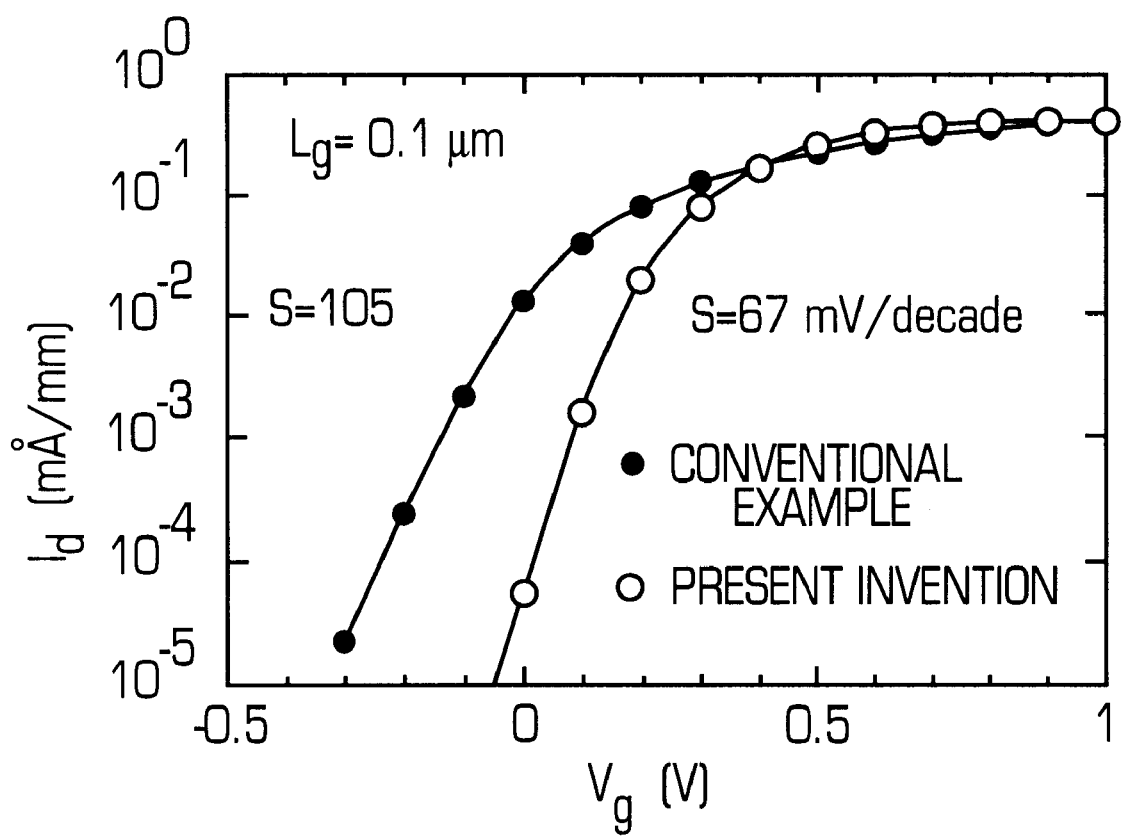
FIG. 9 is a graph showing a relation between a gate voltage, and a drain current.

FIG. 9 shows subthreshold characteristics. The concrete structure of the device of the present invention is the same as the structure measured in FIG. 8. The gate length is as short as 0.1 $\mu$m, and hence, in the case of the conventional example, the threshold voltage decreases, and simultaneously the subthreshold characteristics also deteriorate. An S value which represents an inclination of the subthreshold characteristics is also as large as 105 mV/decade. However, an S value of the present invention is as small as 67 mV/decade, and so the subthreshold characteristics are improved.

Second Embodiment

Figure 6:
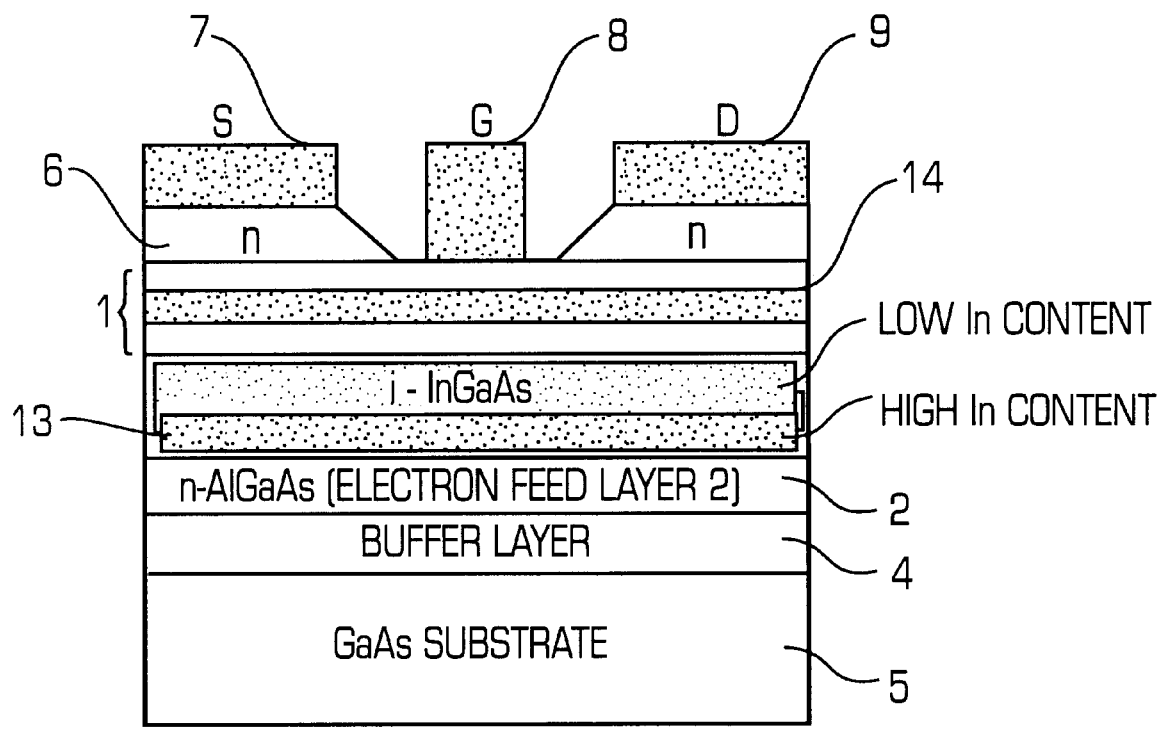
FIG. 6 is a structural view illustrating a second example of the present invention.

Next, the second embodiment of the present invention will be described with reference to a drawing. FIG. 6 is a sectional view of an HJFET showing the second practical aspect of the present invention. The second aspect is different from the structure of FIG. 1 in that an InGaAs layer 13 in which the In composition in the channel layer gradually increases from the side of the electron feed layer 1 toward the side of the electron feed layer 2 comprises the channel layer. An inclination profile of the In composition in the channel layer is not particularly limited, and it may be graded or steplike.

As the In composition increase the energy band lowers, and therefore the energy band of the channel layer 13 further inclines toward the electron feed layer 2 by the use of the InGaAs layer 13 in which the content of the In composition is high on the side of the electron feed layer 2. In consequence, the electrons intensively gather in the hetero interface between the channel layer 13 and the electron feed layer 2, 50 that the effect which has been described with respect to FIG. 5 can be increased. As a result, it is possible to more control the short channel effect.

Furthermore, the electrons of the channel layer 13 are present in a high ratio in a region where the content of the In composition is high, so that the transportation properties of the electrons can be improved and the device characteristics can further be improved.

Third Embodiment

Figure 7:
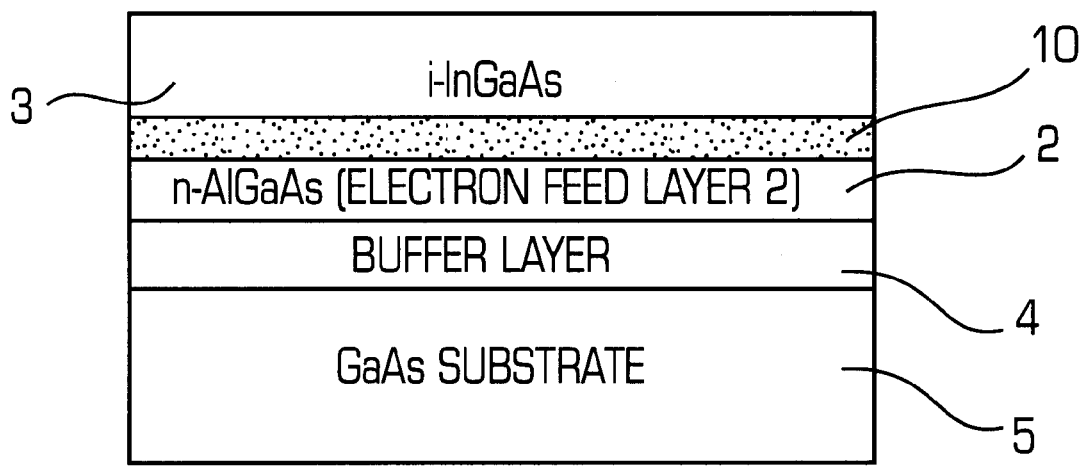
FIG. 7 is a structural view illustrating a third example of the present invention.

Next, the third embodiment of the present invention will be described with reference to a drawing. A structure in FIG. 7 is the same as that in FIG. 1 or FIG. 6 except that an i-AlGaAs spacer layer 10 is interposed between the i-InGaAs channel layer 3 and the n-AlGaAs electron feed layer 2. This spacer layer has a wider band gap than the channel layer, and it usually has a thickness of 10 to 100 Å. Owing to the interposition of this spacer layer, the electrons of the channel layer are subjected minimally to the scattering by ionized impurities from the electron feed layer 2, which results in improved transportation properties of the electrons. Furthermore, in this practical aspect, the channel layer may be formed, changing the In composition in a layer thickness direction, as in the second practical aspect.

As described above, the three-layer structure of 5 n-AlGaAs/n-AlAs/n-AlGaAs is used as the electron feed layer 1, but a material constituting these layers may be a semiconductor having a larger band gap than in the channel layer 3, and examples of the material include semiconductors such as InGap and InAlAs.

Furthermore, the n-AlAs layer which is used as the inside layer of the electron feed layer may be made of any material, so long as it has a larger band gap than an average band gap of the electron feed layer 1. Thus, the material is not limited to AlAs. For example, n-Al$_{0.2}$Ga$_{0.8}$As/n-Al$_{0.7}$Ga$_{0.2}$As/n-Al$_{0.2}$Ga$_{0.8}$As may be used as the electron feed layer 1.

The n-Al$_{0.2}$Ga$_{0.8}$As layer which is used as the electron feed layer 2, may be made of a semiconductor such as InGaP or InAlAs. Furthermore, the substrate is not limited to GaAs and an InP substrate may also be used.

Figure 11:
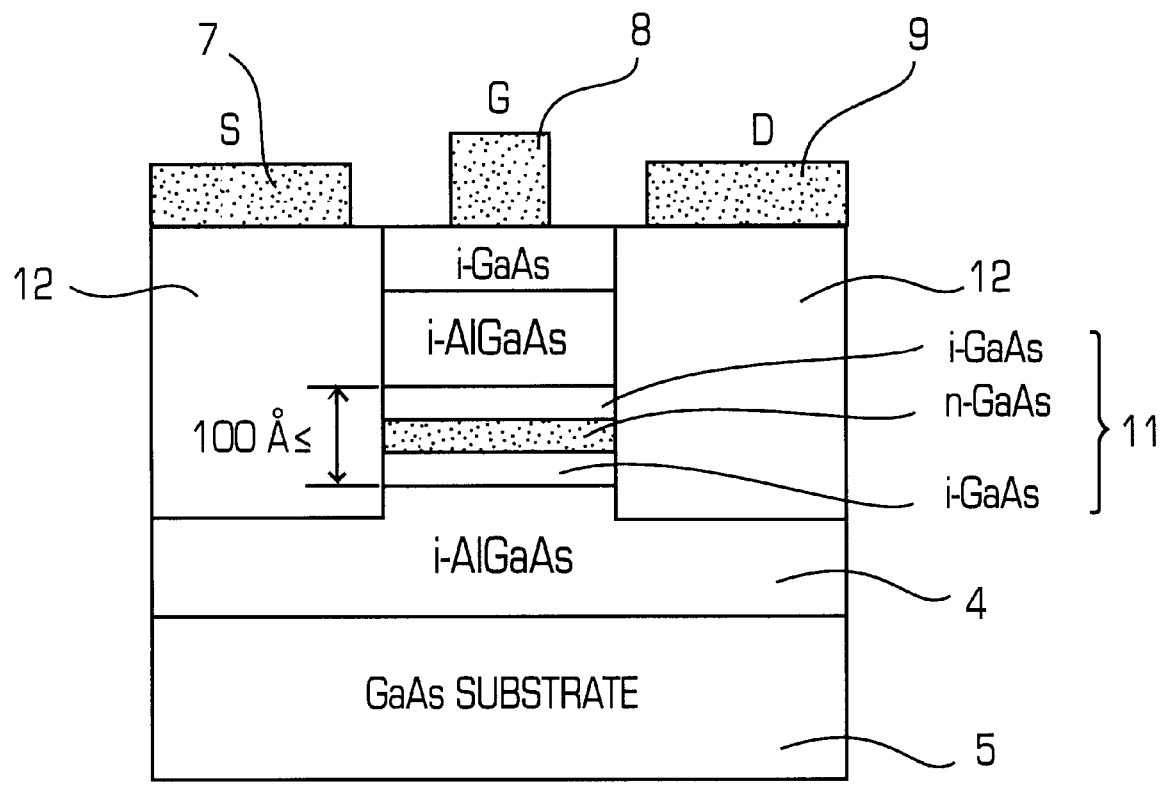
FIG. 11 is a sectional view of another conventional HJFET.

In addition, the alloy region 12 shown in FIG. 11 under the source and drain electrode is not formed in FIG. 1 or FIG. 6. But it may be also employed in the present invention without causing disadvantageous effects.

According to the present invention, a hetero junction type transistor structure can be provided which can control a short channel effect, decrease the fluctuation of a threshold and improve a yield. According to the present invention, a hetero junction type transistor structure can be provided in which the short channel effect can be controlled, whereby subthreshold properties can be improved and a drain current under a threshold voltage can be reduced to decrease the consumption of an electric power. Furthermore, according to the present invention, a hetero junction type transistor structure can be provided in which gm characteristics of the transistor can be improved to obtain excellent device characteristics.

What is claimed is:

1. A hetero junction type field effect transistor comprising:

a semiconductor substrate;

a first electron feed layer comprising a doped semiconductor having a wider band gap than the channel formed on the semiconductor substrate;

a channel layer comprising a non-doped semiconductor formed on the first electron feed layer;

a second electron feed layer made of a doped semiconductor having a wider band gap than the channel layer and having a thickness of 100 Å or less formed on the channel layer in physical contact with the channel layer; and a gate electrode, a source electrode and a drain electrode formed on the second electron feed layer wherein the gate electrode is in physical contact with said second electron feed layer.

2. A hetero junction type field effect transistor comprising:

a semiconductor substrate;

a first electron feed layer comprising a doped semiconductor having a wider band gap than the channel formed on the semiconductor substrate;

a channel layer comprising a non-doped semiconductor formed on the first electron feed layer;

a second electron feed layer comprising a laminate structure of a plurality of semiconductor layers having a wider band gap than the channel layer and having a thickness of 100 Å or less formed on the channel layer in which a lower layer of said laminate structure being in physical contact with said channel layer; and a gate electrode, a source electrode and a drain electrode are formed on the second electron feed layer; wherein said lower layer is doped, one layer of the laminate structure which is not in physical contact with the channel layer is a doped or a non-doped semiconductor having a wider band gap than an average band gap of the laminate structure, and said gate electrode is in physical contract with second electron feed layer.

3. The hetero junction type field effect transistor according to claim 1 wherein the channel layer has a thickness of 40 Å to 70 Å.

4. A hetero junction type field effect transistor comprising:

a semiconductor substrate;

a first electron feed layer comprising a doped semiconductor having a wider band gap than the channel formed on the semiconductor substrate;

a spacer layer comprising a semiconductor having a wider band gap than the channel layer and having a thickness of 10 Å to 100 Å interposed between the channel layer and the first electron feed layer;

a channel layer comprising a non-doped semiconductor formed on the spacer layer;

a second electron feed layer made of a doped semiconductor having a wider band gap than the channel layer and having a thickness of 100 Å or less formed on the channel layer in physical contact with the channel layer; and a gate electrode, a source electrode and a drain electrode formed on the second electron feed layer wherein the gate electrode is in physical contact with said second electron feed layer.

* * * * *

UNITED STATES PATENT AND TRADEMARK OFFICE
CERTIFICATE OF CORRECTION

PATENT NO. : 5,959,317
DATED : September 28, 1999
INVENTOR(S) : Takaki NIWA

It is certified that error appears in the above-identified patent and that said Letters Patent is hereby corrected as shown below:

Column 8,   line 21,   delete the second occurrence of "14a" and insert --14b--.

Column 10,  line 14,   delete "50" and insert --so--.

Signed and Sealed this

Eleventh Day of April, 2000

Q. TODD DICKINSON

*Attest:*

*Attesting Officer*          *Director of Patents and Trademarks*